United States Patent [19]

Lee et al.

[11] 4,322,675
[45] Mar. 30, 1982

[54] REGULATED MOS SUBSTRATE BIAS VOLTAGE GENERATOR FOR A STATIC RANDOM ACCESS MEMORY

[75] Inventors: Yong K. Lee, Mountain View; Joseph R. Domitrowich, San Martin, both of Calif.

[73] Assignee: Fairchild Camera & Instrument Corp., Mountain View, Calif.

[21] Appl. No.: 203,183

[22] Filed: Nov. 3, 1980

[51] Int. Cl.³ .................... H03L 1/00; H03K 3/353
[52] U.S. Cl. .................. 323/277; 323/274; 307/297; 307/304; 307/200 B
[58] Field of Search ............ 323/273, 274, 275, 276, 323/277, 278; 363/59, 60, 61; 307/296 R, 297, 304, 200 A, 200 B

[56] References Cited

U.S. PATENT DOCUMENTS

| | | | |
|---|---|---|---|
| 3,794,862 | 2/1974 | Jenne | 307/304 |
| 3,806,741 | 4/1974 | Smith | 307/304 |
| 4,049,980 | 9/1977 | Maitland | 307/304 |
| 4,115,710 | 9/1978 | Lou | 307/304 |
| 4,142,114 | 2/1979 | Green | 307/304 |
| 4,229,667 | 10/1980 | Heimbigner et al. | 307/297 |

*Primary Examiner*—William M. Shoop
*Assistant Examiner*—Peter S. Wong
*Attorney, Agent, or Firm*—Paul J. Winters; Theodore Scott Park; Michael J. Pollock

[57] ABSTRACT

A regulated substrate bias voltage generating system for maintaining a minimum data retaining current through an associated MOS memory. The negative substrate bias voltage is generated by a charge pump operating under the control of a two-phased output oscillator, the operation of which is enabled and disabled by the output signals from a MOS memory over-current sensor, a MOS memory under-current sensor, and a bias voltage level sensor.

6 Claims, 1 Drawing Figure

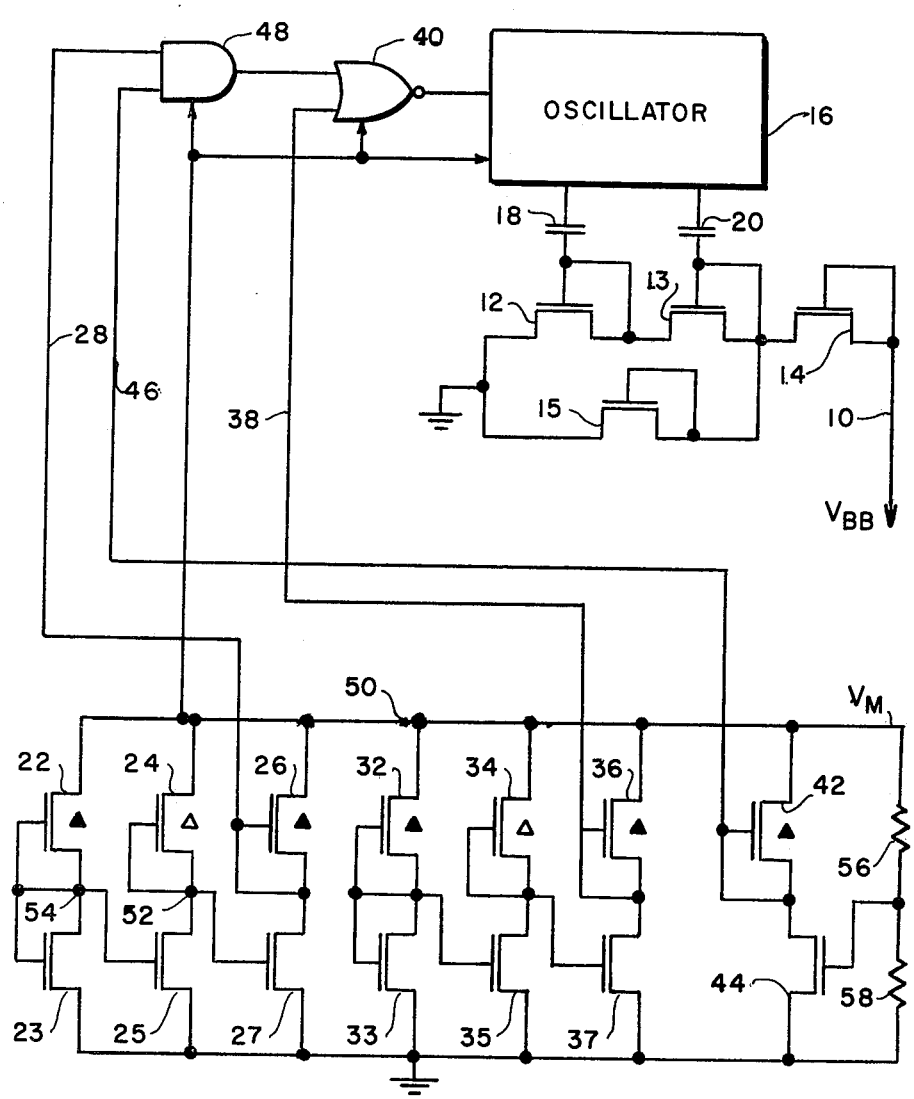

4,322,675

REGULATED MOS SUBSTRATE BIAS VOLTAGE GENERATOR FOR A STATIC RANDOM ACCESS MEMORY

TECHNICAL FIELD

This invention relates to MOS microcomputer circuitry and particularly to MOS circuitry for regulating the level of substrate bias voltage applied to a static random access memory, hence maintaining the data sustaining current through the memory.

BACKGROUND ART

Most modern integrated circuit microcomputers contain a random access memory designed to contain temporary data or instructions for operation of the microcomputer. The data stored in a static random access memory is destroyed or lost whenever the current through the memory drops below a minimum data sustaining level, and an excessive current through the memory load transistor affects the reliability of the memory by limiting the useful life of the transistor by overheating. A proper load current is therefore necessary.

The load current in a typical N-channel silicon gate MOS transistor circuit is determined by the threshold voltage of the depletion load device. A greater negative bias voltage increases the threshold voltage and results in lower load currents. Conversely, a more positive bias voltage decreases the threshold voltage and results in higher load current. For proper regulation of the memory load current, it is necessary to provide regulation of the bias voltage generating circuits.

The circuitry disclosed herein provides and maintains proper bias voltage regulation for an associated static random access memory to therefore provide a proper data sustaining current through the memory.

DISCLOSURE OF THE INVENTION

The circuitry of the present invention includes two current comparator circuits that compare the currents through sample memory load transistors with a generated reference current. One of the sample transistors is constructed similarly to, but slightly larger than the light depletion memory load transistor and produces an output voltage signal indicating an excessive and unnecessarily high current is flowing through the memory. The second sample light depletion transistor is slightly smaller than the memory load transistor and its comparator produces an output indicating a low load current that may result in loss of memory data. The output of these two comparators, together with the third signal indicative of the substrate bias voltage level demanded by the enhancement transistors, are gated together to either enable or inhibit an oscillator that controls a charge pump which, in turn, generates a proper negative substrate bias voltage that will produce a minimum data retaining current in the random access memory circuits.

BRIEF DESCRIPTION OF THE DRAWING

The single FIGURE in the drawing is a schematic circuit diagram of the regulating circuitry of the invention.

BEST MODE FOR CARRYING OUT THE INVENTION

As illustrated in the circuitry of the drawing, a negative bias voltage, $V_{BB}$, is generated on the output conductor 10 of a charge pump circuit including the MOS transistors 12, 13, 14 and 15. The source element of transistor 12 is coupled to ground reference and the transistors 12, 13 and 14 are connected in series so that the drain element of transistor 14 is connected to the output conductor 10. The gate elements of transistors 12, 13 and 14 are connected to their own drain elements and the series transistors 12 and 13 are shunted with the transistor 15, the source element of which is connected to ground reference and the gate and drain element of which is connected to the interconnection of transistors 13 and 14. Pumping action of the charge pump is under the control of an oscillator 16 that produces two oppositely phased signals through capacitors 18 and 20 to the gates of transistors 12 and 13, respectively. While oscillator 16 is functioning, the bias voltage on conductor 10 is driven more negatively; conversely, while the oscillator 16 is inhibited, the bias voltage on conductor 10 drops or goes less negative. The regulation circuitry of the invention provides a relatively constant substrate bias voltage at the conductor 10 so that the static random access memory receiving the bias voltage will maintain a current necessary to prevent loss of the data stored therein.

Oscillator 16 is inhibited or enabled by an over-current comparator, an under-current comparator and the enhancement transistor threshold substrate bias voltage sensor, the combined outputs of which are suitably gated to either inhibit or enable the oscillator 16. All transistors in the comparators and sensor are on the same substrate with the memory components and are therefore subjected to the same bias voltage.

The over-current comparator comprises transistors 22 through 27 and detects when the current through the memory load transistor is greater than the prescribed limit. When this occurs, the comparator generates a low oscillator enabling output signal into the conductor 28 which provides one input to the AND-gate 48.

The under-current comparator comprising transistors 32 through 37 detects when the current through the memory load transistor is lower than the prescribed limit. When this occurs, the comparator generates a high output signal through conductor 38 into the NOR-gate 40 thereby produce a low inhibiting signal into the oscillator 16 which, in turn, shuts off the charge pump and reduces the negative substrate bias voltage on the output conductor 10. As previously mentioned, the lower or less negative bias voltage in the random access memory permits an increased memory current for maintaining the data stored therein. The third regulation signal is provided by transistors 42 and 44 which produces a high output signal on the conductor 46 whenever the substrate bias is sufficient to turn off the transistor 44, the gate of which is held near the threshold.

It should be noted that the memory power supply voltage conductor 50 may be either at the $V_{cc}$ voltage of the associated microcomputer employing the memory or may be at a standby voltage supplied, for example, by an external battery that is applied to the memory voltage conductor 50 whenever the computer system $V_{cc}$ is turned off. During periods that the $V_{cc}$ is turned off it is obvious that a suitable voltage must appear on the memory voltage conductor 50 as well as a proper substrate bias voltage on the conductor 10 in order to maintain the data stored in the memory. For this reason, oscillator 16 and the associated gating circuits 40 and 48, are not operated directly from the system $V_{cc}$ but are connected for operation from the memory voltage conductor 50 so that their operation can be maintained during standby periods.

The overcurrent comparator is a current mirror and includes MOS transistors 22 and 23 connected in series between conductor 50 and ground reference. Transistor 22 is a heavy depletion transistor, indicated by the solid triangle in the drawing, and is coupled between the memory voltage conductor 50 and the drain element of the enhancement transistor 23. The gate elements of transistors 22 and 23 are connected together and to their source-drain interconnection where a reference current is established that is mirrored into the following inverter circuit comprising transistors 24 and 25.

The inverter circuit comprises transistors 24 and 25 in series. Transistor 24 is a light depletion transistor with its drain element connected to the memory voltage conductor 50 and its gate element connected to its source conductor, which point defines the output of the inverter. Enhancement transistor 25 is similar to the enhancement transistor 23 in the voltage divider pair 22 and 23 and the gate of transistor 25 is coupled to the output point at the interconnection of transistors 22 and 23. Light depletion enhancement transistor 24, indicated by the open triangle, is physically constructed to be slightly shorter than the memory load transistor so that the transistor 24 may draw a slightly larger current than the predetermined norm for the memory transistor. Transistor pairs 22-23 and 24-25 comprise a current mirror wherein transistors 22 and 23 establish a reference current which is mirrored into the inverter pair. If the light depletion load transistor 24 is capable of providing more than the demanded current through the inverter pair 24 and 25, then the voltage at the inverter output point 52 will be higher than the voltage at the divider output point 54 and will therefore exceed the threshold voltage necessary to turn on the enhancement transistor 27 in the subsequent inverter circuit. If the current through the transistor 24 is near its turnoff point, the voltage at point 52 will be low, therefore cutting off conduction through the transistor 27 in the inverter circuit. This inverter circuit includes a high depletion transistor 26 connected to the RAM voltage conductor 50 and the transistor 27 coupled between ground reference and the source element of transistor 26. The gate of transistor 27 is coupled to the output point 52 and the gate of transistor 26 is coupled to its source element and to the output conductor 28.

Very briefly reviewing, output conductor 28 will carry a high signal if the current through the load depletion sampling transistor 24 and its associated enhancement transistor 25 is lower than the current established through the voltage divider pair comprising transistors 22 and 23. If the construction of a light depletion transistor 24 is such that it permits a current flow that exceeds that which is established at the output point 54, then the point 52 goes high to turn on transistor 27 and generate a low output on the conductor 28, thereby indicating excessive current through the memory load transistor.

The comparator comprising transistors 32-37 is identical in construction and in operation with the comparator comprised of transistors 20 through 27 with the one exception that the light depletion transistor 34 is constructed to be slightly longer than the memory load transistor and therefore draws slightly less current. Therefore, when current through the memory load transistor is too low, there will be no current flow through transistor 34 and its associated enhancement transistor 35 so that the inverter transistor 37 will be non-conductive and a high output will be established on the conductor 38. A low input from conductor 38 into the NOR-gate 40 will inhibit operation of the oscillator 16 and its charge pump and the output voltage on conductor 10 will go in a positive direction. As previously mentioned, the lower negative bias voltage in the memory will result in a higher current through the memory transistors.

A third control is provided by heavy depletion transistor 42 in series with the enhancement transistor 44. The drain of transistor 42 is connected to the memory voltage conductor 50 and the source of transistor 44 is connected to ground reference. A voltage divider comprising series resistors 56 and 58 in series between the memory voltage conductor 50 and ground reference establishes a fixed fraction of the memory voltage which is at the approximate threshold level and which is applied to the gate of the transistor 44. If the substrate bias voltage level is sufficiently negative to turn off the transistor 44, the high output voltage established at the interconnection of transistors 42 and 44 is carried by conductor 46 to provide one input to the AND-gate 48.

To summarize the operation of the three individual sensors: an excessively high current through the memory transistor will result in conduction through transistor 24 and a low output on conductor 28. A sub-normal current through the memory transistor will result in a lack of current flow through the transistor 34 to produce a high output on the conductor 38. The level of substrate bias is monitored by the transistor 44 which is turned off to provide a high output on the conductor 46 when the substrate bias level becomes excessive.

In the operation of the sensors in a complete substrate bias voltage controller, the low current sensor comprising transistors 32 through 37 will maintain the memory load current above a minimum necessary for maintaining stored data by disabling oscillator 16 thereby producing a more positive $V_{BB}$ output and an increased memory load current.

Another condition for the substrate bias voltage is to keep the threshold voltage of enhancement transistor 44 in the proper range. This control is provided by the circuitry formed by the series resistors 56 and 58 and the inverter implemented by the transistors 42 and 44. If the threshold of transistor 44 is more positive than the voltage level provided by the resistor voltage divider, then the transistor 44 turns off and the output of the inverter applied to the AND-gate 48 will be high to disable the oscillator 16. If the output of the overcurrent sensor comprising transistors 22 through 27 is high indicating that the memory current does not exceed yet its upper limit, the output of AND-gate 48 will be high so that the oscillator 16 is disabled. Now, the substrate bias voltage goes more and more positive until a level is reached at which the overcurrent sensor will switch its output to a low level, indicating an upper limit of memory load current. This low output signal from the overcurrent sensor will produce a low output of AND-gate 48 irrespective of the level at the output of the inverter circuit controlled by the condition of enhancement transistor 44. Therefore oscillator 16 becomes enabled and the substrate bias voltage goes more negative, resulting in lowering the memory load current.

Thus, the undercurrent sensor controls the most negative level of the substrate bias voltage by disabling the oscillator 16 to keep the memory alive; and the overcurrent sensor controls the most positive level of the substrate bias voltage by enabling the oscillator 16 even if the enhancement transistor threshold control circuit demands a more positive substrate.

We claim:

1. MOS bias voltage regulating circuitry for establishing a predetermined substrate bias voltage level for an associated static random access memory, said regulating circuitry including an oscillator for generating a pair of oppositely phased output signals, a charge pump coupled to said oscillator and responsive to said pair of output signals for generating the bias voltage output, and control circuitry for controlling the operation of said oscillator, said control circuit comprising:

under-current sensing circuitry for generating an oscillator inhibiting signal whenever the memory current drops below a predetermined level;

bias voltage level sensing circuitry for generating a second oscillator inhibiting signal when the substrate bias voltage level exceeds a predetermined level; and over-current sensing circuitry for generating an oscillator enabling signal whenever said memory current exceeds a predetermined level, said enabling signal controlling the operation of said oscillator irrespective of the existence of said second oscillator inhibiting signal.

2. The control circuitry claimed in claim 1 wherein said over-current sensing circuitry includes voltage dividing circuitry, the current output from which is referenced to a first inverter comprising an enhancement transistor in series with a light depletion transistor constructed to conduct a slightly greater current than a predetermined normal memory current.

3. The control circuitry claimed in claim 2 further including a second inverter circuit coupled to the output of said first inverter circuit and responsive to the voltage level at said output of said first inverter circuit for generating a low output signal for enabling the oscillator whenever said over-current sensing circuitry senses an excessive memory current.

4. The control circuitry claimed in claim 1 wherein said under-current sensing circuitry includes voltage dividing circuitry, the current output from which is referenced to a third inverter comprising an enhancement transistor in series with a light depletion transistor constructed to conduct slightly less current than a predetermined normal memory current.

5. The control circuitry claimed in claim 4 further including a fourth inverter circuit coupled to the output of said third inverter circuit and responsive to the voltage level at said output of said third inverter circuit for generating a high output signal for inhibiting the operation of said oscillator whenever said memory current drops below a predetermined level.

6. The control circuitry claimed in claim 1 wherein said bias voltage level sensing circuitry includes an enhancement transistor in series with a heavy depletion transistor and coupled between a source of memory voltage and ground reference, the gate of said enhancement transistor being coupled through voltage dividing circuitry providing a fixed fraction of said memory voltage to said gate, said enhancement transistor becoming non-conductive to produce a high output signal for inhibiting the operation of said oscillator by a negative increase in substrate bias voltage above a predetermined level.

* * * * *